United States Patent

Aronowitz et al.

[11] Patent Number: 6,117,749
[45] Date of Patent: Sep. 12, 2000

[54] MODIFICATION OF INTERFACIAL FIELDS BETWEEN DIELECTRICS AND SEMICONDUCTORS

[75] Inventors: Sheldon Aronowitz, San Jose, Calif.; Kranti Anand, deceased, late of Sunnyvale, Calif., by Madhu Anand, legal representative

[73] Assignee: National Semiconductor Corporation, Santa Clara, Calif.

[21] Appl. No.: 07/668,365

[22] Filed: Mar. 13, 1991

(Under 37 CFR 1.47)

Related U.S. Application Data

[63] Continuation of application No. 07/099,048, Sep. 21, 1987, abandoned.

[51] Int. Cl.[7] .............................. H01L 21/31; H01L 29/78
[52] U.S. Cl. .................................. 438/454; 148/DIG. 3; 148/DIG. 24; 148/DIG. 60; 257/405; 257/651; 438/294; 438/353; 438/783
[58] Field of Search ................................. 437/10, 11, 12, 437/24, 25, 28, 37, 45, 247, 238, 939, 941; 357/28, 52, 91; 148/DIG. 3, DIG. 24, DIG. 60, DIG. 97, DIG. 127; 257/405, 651

[56] References Cited

U.S. PATENT DOCUMENTS

| | | | |
|---|---|---|---|
| 3,310,442 | 3/1967 | Winstel et al. | 437/12 |
| 3,328,210 | 6/1967 | McCaldin et al. | 437/37 |
| 3,347,719 | 10/1967 | Heywang | 437/12 |
| 3,480,474 | 11/1969 | Emeis et al. | 437/10 |
| 3,549,433 | 12/1970 | Renner et al. | 437/12 |
| 3,664,895 | 5/1972 | Schaefer et al. | 437/12 |
| 3,874,936 | 4/1975 | d'Hervilly et al. | 437/11 |
| 4,007,294 | 2/1977 | Woods et al. | 437/24 |
| 4,622,082 | 11/1986 | Dyson et al. | 437/247 |
| 4,629,514 | 12/1986 | Suda | 437/945 |
| 4,710,478 | 12/1987 | Yoder et al. | 437/22 |

FOREIGN PATENT DOCUMENTS

| | | |
|---|---|---|
| 0213972 | 3/1987 | European Pat. Off. . |
| 2325196 | 4/1977 | France . |
| 2395606 | 1/1979 | France . |
| 2752698 | 6/1978 | Germany . |
| 0125848 | 2/1981 | Japan . |
| 2028582 | 3/1980 | United Kingdom ..................... 437/45 |
| 1566072 | 4/1980 | United Kingdom . |

OTHER PUBLICATIONS

Abstract No. 287 & Extended Abstract, L. Krusin–Elbaum, "Changes in the Flatband Voltage of Si–MOS vs. Distribution of Cesium in $SiO_2$: Comparison of Two Implantation Methods", Electrochemical Society, Oct. 1985.

Krusin–Elbaum et al, "Shifts in the Flatband Voltage of Metal–Oxide–Silicon Structure Due to Iodine in $SiO_2$", Appl. Phys. Lett. 48(2), Jan. 13, 1986, pp. 177–179.

Wolf et al., Silicon Processing for the VLSI Era, vol. 1: Process Technology, Lattice Press, 1986, pp. 314–317.

Wolf et al., "Silicon Processing For the VLSI Era," Lattice Press, Sunset Beach, CA 1986, pp 66–70.

"Tunable Flatband Shifts Via Negative Charge Implantation into Gate Oxide," IBM TDB, vol. 28 No. 7 Dec. 1985, pp3008–9.

Primary Examiner—Mary Wilczewski
Attorney, Agent, or Firm—Skjerven, Morrill MacPherson, Franklin & Friel LLP; Edward C. Kwok

[57] ABSTRACT

Reduction in the net charge at the interface of a dielectric and a semiconductor material is achieved by placing atomic species in the dielectric near the interface. Preferably, these species are selected from the group of alkaline earth metals. The presence of these atoms results in a redistribution of the electronic density near the interface. The placement of the atoms is effected by ion implantation followed by multiple annealing steps at alternating low and high temperatures.

6 Claims, 4 Drawing Sheets

6,117,749

MODIFICATION OF INTERFACIAL FIELDS BETWEEN DIELECTRICS AND SEMICONDUCTORS

This application is a continuation of application Ser. No. 07/099,048, filed Sep. 21, 1987, now abandoned.

BACKGROUND OF THE INVENTION

The present invention is directed to semiconductor devices such as transistors and the like, and more particularly is concerned with the modification of surface fields in the active regions of the devices.

The electrical field which inherently exists at the surface of an active region of a semiconductor device influences one or more of the operating characteristics of that device. For example, in an MOS field effect transistor, the field which exists at the interface of the gate oxide and the active channel region determines the threshold voltage of the device and the mobility of carriers. When the active channel region is comprised of doped silicon and the gate oxide comprises silicon dioxide, the nature of this interface is that it always has a positive charge. As a result, an n-channel MOS device typically operates in a depletion mode. It is desirable to be able to introduce a stable negative charge at the interface of the silicon and the gate oxide, to thereby reduce the positive field that exists at this interface and produce a more neutral device, or even an enhancement mode device.

Similarly, in bipolar transistors it is desirable to operate with low collector currents to thereby reduce power requirements. However, the low current gain of the transistor is affected by the recombination of carriers at the surface of the base region. This recombination is dependent upon the field which exists at this surface. If this field can be appropriately controlled, the surface recombination velocity can be influenced to bring the low current cutoff of the transistor lower.

Accordingly, it is desirable to be able to control the electric field that exists at the surface of a material in a monolithic device. In particular, it is desirable to be able to lower the net positive charge that is inherently present at the interface of a dielectric material and a semiconductor material.

BRIEF STATEMENT OF THE INVENTION

In accordance with the present invention, these objectives are achieved through the placement of atomic or molecular species within the crystal structure of a dielectric material. In a preferred embodiment of the invention, these species are selected from the group of alkaline earth metals. Placement of a constituent selected from this group at a location within the dielectric, but close to the interface of the dielectric material and the semiconductor material, results in an electronic density redistribution that donates electronic density to the structure. This change in electronic density contributes to a reduced positive interfacial charge or, in some cases, a negative effective interfacial charge.

The additive species must be placed sufficiently close to the interface that this reduction in the net charge is exhibited in the interfacial field. However, since the atoms of the alkaline earth metals contribute electrons to the structure, each atom has a net positive charge associated with it, i.e., it becomes a positive ion. Therefore, these ions must be at a distance from the interface that their net positive charge is insulated from the field at the interface, thereby permitting the electronic density shift to the other atoms in the structure to predominate.

In the preferred method, the species is introduced into the dielectric structure through ion implantation followed by thermal activation, such as annealing. The energy of the ion implantation process should be chosen such that the projected range of the implanted species insures that its distribution peak is on the dielectric side of the dielectric/semiconductor interface after the thermal activation. Preferably, the thermal activation comprises a multi-step annealing process. In the first step, the structure is annealed at a relatively low temperature, e.g. less than 600° C., in a non-oxidizing atmosphere. Subsequently, an anneal is carried out at a much higher temperature, e.g., in the range of 900–1100° C., in the same or a different non-oxidizing atmosphere. Either or both of these steps can be repeated to repair lattice damage as desired.

As an alternative, the species can be introduced into the host dielectric matrix through the ion cluster beam (ICB) technique. With this approach, both the host matrix and the additive species can be produced with good control of the deposition rate and stoichiometry.

BRIEF DESCRIPTION OF THE DRAWINGS

Further features of the present invention and the advantages offered thereby are described in the following examples, and experimental results relating to these examples are illustrated in the accompanying figures.

DESCRIPTION OF PREFERRED EMBODIMENTS

Figure 1:
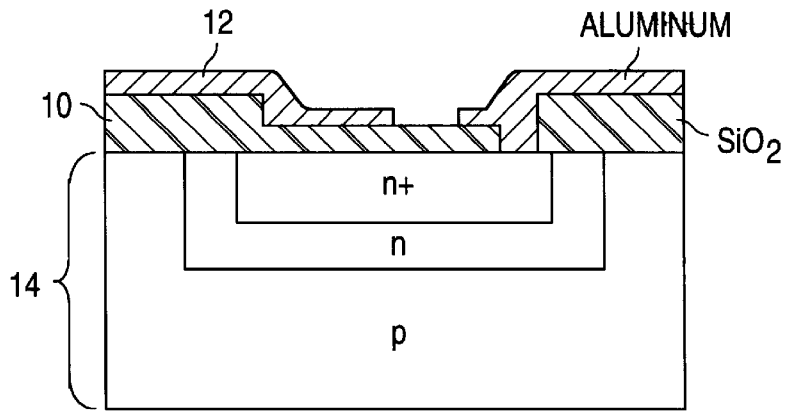
FIG. 1 is a cross-sectional view of an MOS capacitor.

In the following description of examples of the invention, particular reference is made to MOS structures, where such reference facilitates an understanding of the invention. It will be appreciated, however, that the applicability of the invention is not limited to this particular type of structure. Rather, the field modification that is achieved with the present invention can be employed in bipolar devices as well as MOS structures.

Briefly, the basic principle underlying the present invention is the modification of surface fields in semiconductor structures through the placement of atomic species within a host lattice at a location in the vicinity of the surface of the host material. More particularly, the present invention is directed to the reduction, and more preferably polarity inversion, of the interfacial field between a dielectric material and a semiconductor material. In accordance with the invention, this reduction can be achieved by placing atoms of elements from groups 1a, 2a or 3a of the Periodic Table of Elements in a host dielectric structure. Since each of these elements has a relatively small number of valence electrons, it will readily donate electronic density to the structure. Therefore, by placing atoms of these elements at the dielectric/semiconductor interface, a net reduction of the positive electric charge can be achieved.

In the case of group 1a and group 3a elements, however, it has been found that the particular lattice site for the constituent is critical to the attainment of the desired results. More particularly, through theoretical modeling it has been found that placement of the group 1 elements sodium and potassium at one interstitial site of two linked oxide crystal cells will result in a negative effective charge at the surface of the material, but placement of these same elements at a different interstitial site will result in a net positive charge. In particular, placement of an atom at interstitial site 2, which is the site defined by the coordinates (−1.5258, 0, 4.3288) in two linked beta-cristobalite cells, results in the negative effective charge, but placement at site 1, which is the site having the coordinates (0, 0, 4.3288), results in the positive effective charge. Thus, to attain a net reduction in the field at the surface of the host material, it is necessary to ensure that the additive species are located at the proper lattice site. This critical dependence upon the particular site for placement of the atomic species is believed to be similarly applicable to group 3 elements.

In contrast, however, the alkaline earth metals of group 2a provide substantially increased results relative to site placement. For example, calcium exhibits a negative effective charge at all three available interstitial sites, although the magnitude of the charge is greatest if the calcium is located at site 2. Experimental results indicate that strontium and barium also produce negative effective charges regardless of the particular site location. Accordingly, the alkaline earth metals are the most preferred species for placement in a dielectric structure, since net reduction of the surface field is not dependent upon site placement.

The following examples are provided to illustrate the behavior of devices resulting from the implantation of calcium into silicon dioxide structures.

EXAMPLE I

Layers of oxide were thermally grown on wafers of 6–9 ohm-cm n-type 100 silicon. The average thickness of the oxide layers was 770 angstroms±10 angstroms.

The wafers were divided into three groups. One group of wafers was implanted with calcium at a dose of $1\times10^{12}$ cm$^{-2}$. A second group of wafers was implanted with calcium at a dose of $1\times10^{13}$ cm$^{-2}$. A third group, which functioned as the control group, was implanted with krypton at a dosage of $1\times10^{13}$ cm$^{-2}$. The implant energies were chosen so that the predicted range ($R_p$) for each implant would be in the oxide near the SiO$_2$/Si interface.

All of the samples were then annealed in the following sequence:

1. 450° C. for 40 minutes in a forming gas comprised of 80% N$_2$ and 20% H$_2$.
2. 1100° C. for 30 minutes in pure nitrogen.
3. 450° C. for 40 minutes in the forming gas.

MOS capacitors each having a silicon dioxide dielectric 10 interposed between an aluminum gate 12 and the silicon substrate 14, as shown in FIG. 1, were then constructed with each wafer. The capacitance of each capacitor was measured at a frequency of 1 MHz at room temperature and at a biased temperature of 300° C.

Figure 2:
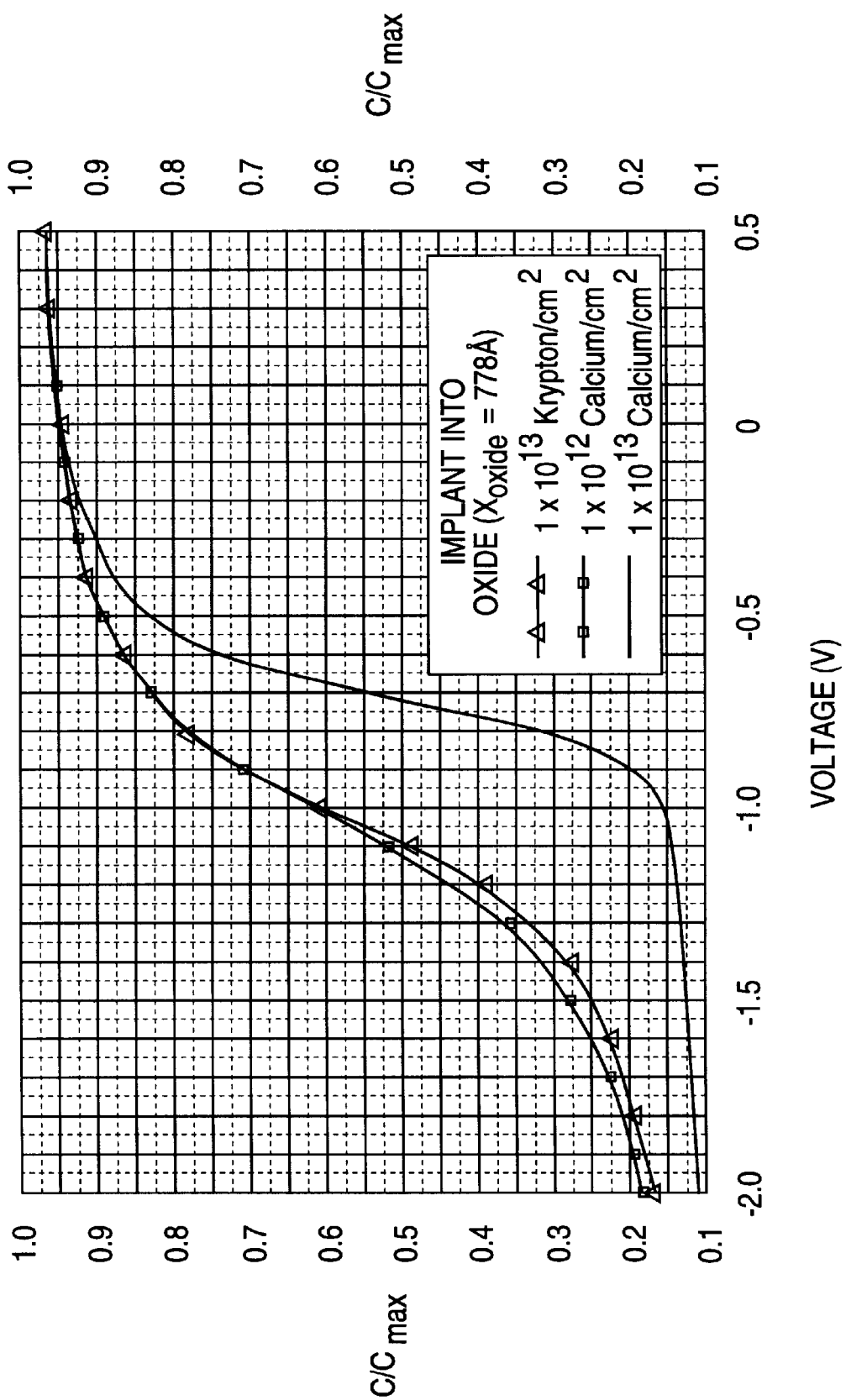
FIG. 2 is a collector/voltage (C/V) graph illustrating the capacitance of an MOS capacitor having various concentrations of calcium and krypton implanted into its oxide.

The results of these measurements are indicated in the capacitance-voltage (C/V) diagram of FIG. 2. As can be seen from the figure, the higher dose calcium implant shifts the capacitance of the structure to the right with respect to the lower dose calcium implant. Basically, the structure behaves as though an additional fixed negative charge is present at the dielectric/semiconductor interface.

The reduced capacitance curve resulting from the $10^{13}$ cm$^{-2}$ krypton implant coincides with the lower dose calcium curve. This data establishes the fact that the shift to the right which is found for the higher dose calcium implant is not due to lattice damage. Since krypton is more massive than calcium, a change in capacitance due to damage would have produced higher results for the krypton than for the equivalent dose of calcium.

EXAMPLE II

Layers of oxide were grown on silicon wafers. The wafers were SEH, 100, p-type, 11–18 ohm-cm substrates and SEH, 100, n-type, 5–9 ohm-cm substrates. The oxide layers were grown with dry HCl process at 900° C. to a thickness of 750 angstroms.

The samples were implanted with calcium at respective doses of $10^{12}$, $10^{13}$ and $10^{14}$ cm$^2$. The implant energy was chosen at 70 KeV so that $R_p$ was about 560 angstroms. This depth insured that the distribution peak of the calcium remained on the oxide side of the silicon dioxide/silicon interface after annealing.

MOS capacitors were formed, and the samples were annealed in the following sequence:

1. 450° C. for 20 minutes in a mixture of 90% N$_2$ and 10% H$_2$.
2. 750° C. for 30 minutes in pure nitrogen.
3. 450° C. for 20 minutes in a mixture of 90% N$_2$ and 10% H$_2$.
4. 905° C. for 30 minutes in pure nitrogen.
5. 450° C. for 20 minutes in a mixture of 90% N$_2$ and 10% H$_2$.
6. 500° C. for 20 minutes in a mixture of 90% N$_2$ and 10% H$_2$A control group of samples, which did not have calcium implanted into the oxide, was annealed in the same manner. The capacitance-voltage characteristics of the samples were measured at high frequency (about 100 KHz) after each anneal step using a non-destructive mercury probe technique. Between each anneal, the samples were cleaned in a boiling H$_2$O$_2$/H$_2$SO$_4$ solution to remove any trace of mercury.

Table I below shows the change in a relevant parameter of the implanted samples, $V_{min}$, as a function of the various anneals, relative to the control group. $V_{min}$ represents the voltage at which the MOS structure is inverted and hence corresponds to the threshold voltage for a long-channel transistor. Therefore, this value directly senses the total charge at the structure at the inversion point. This parameter was chosen instead of the flat band voltage $V_{fb}$ for the structure, since it is easier to identify.

TABLE I $V_{min}$ Shifts Associated with Calcium Implant into SiO$_2$
$10^{13}$ Ca$^+$/cm$^2$ implant into 750 Å oxide

| | ANNEALS | | | | |
|---|---|---|---|---|---|
| | #1 | #2 | (#3 + #4) | #5 | #6 |
| $V_{min}$ | −5.7 | −6.2 | −1.0 | +0.4 | +0.8 |
| $V_{min}$ (control) | 0 | 0 | 0 | 0 | 0 |

Figure 3A:
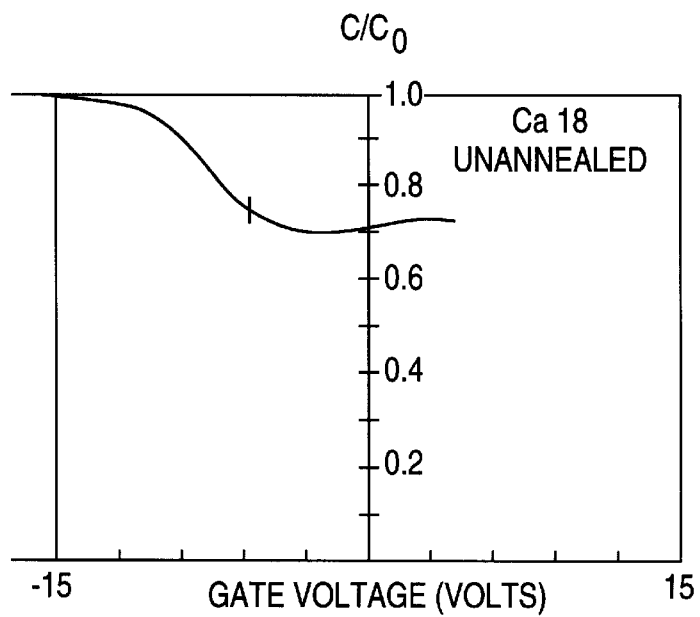
FIGS. 3a and 3b represent the C/V characteristics of another example of the invention prior to annealment and after a final annealing step, respectively.
Figure 3B:
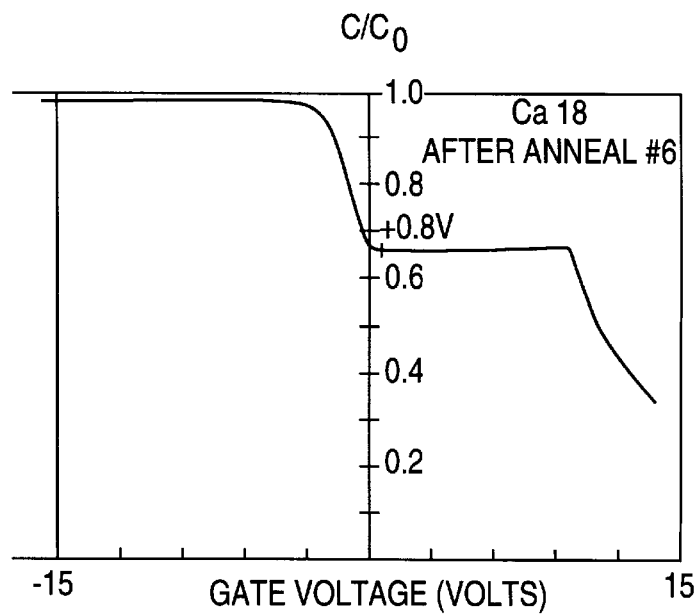

The C/V data for the implanted samples prior to annealing and after the final anneal are illustrated, respectively, in FIGS. 3a and 3b.

The data contained in Table I indicates a maximum shift in $V_{min}$ of 7.0 volts, i.e., (+0.8−(6.2)). These shifts are in the positive direction for each anneal. Thus, the total field charge is becoming less positive (more negative). Examination of the practical C/V data illustrates that the maximum error in the location of $V_{min}$ is ±0.15 volts. Thus, the shifts in $V_{min}$ illustrated in Table I are so large, compared to either the uncertainty in the $V_{min}$ value or the maximum voltage that could be attributed to lattice damage, that the conclusion represented by the data is that the charge exchange is associated with the calcium atoms during the annealing procedure.

The samples implanted with the calcium also exhibit a low dissipation factor (D) of about 0.03, in contrast with that of the control sample, which is about 0.2. This parameter provides a good measure of the quality of the oxide in the MOS capacitor. The data indicates that the presence of the calcium atoms does not increase the resistive losses within the structure which might have been expected on the basis of damage to the oxide/silicon interface.

To provide optimum contribution to the change in the interfacial field, the species added to the dielectric should be located near, but not at, the interface. If located at the interface, the positive ions which result when the additive species give up a valence electron would cancel the effect which the free electrons have on the field. Thus, the implanted ions should be located at least two atomic layers away from the interface, and preferably be in the range of 2–20 atomic layers from the interface, to isolate them from the surface field. The implant energy should be chosen so that the implanted species becomes located within this range of distances from the interface after final processing.

EXAMPLE III

Figure 4A:
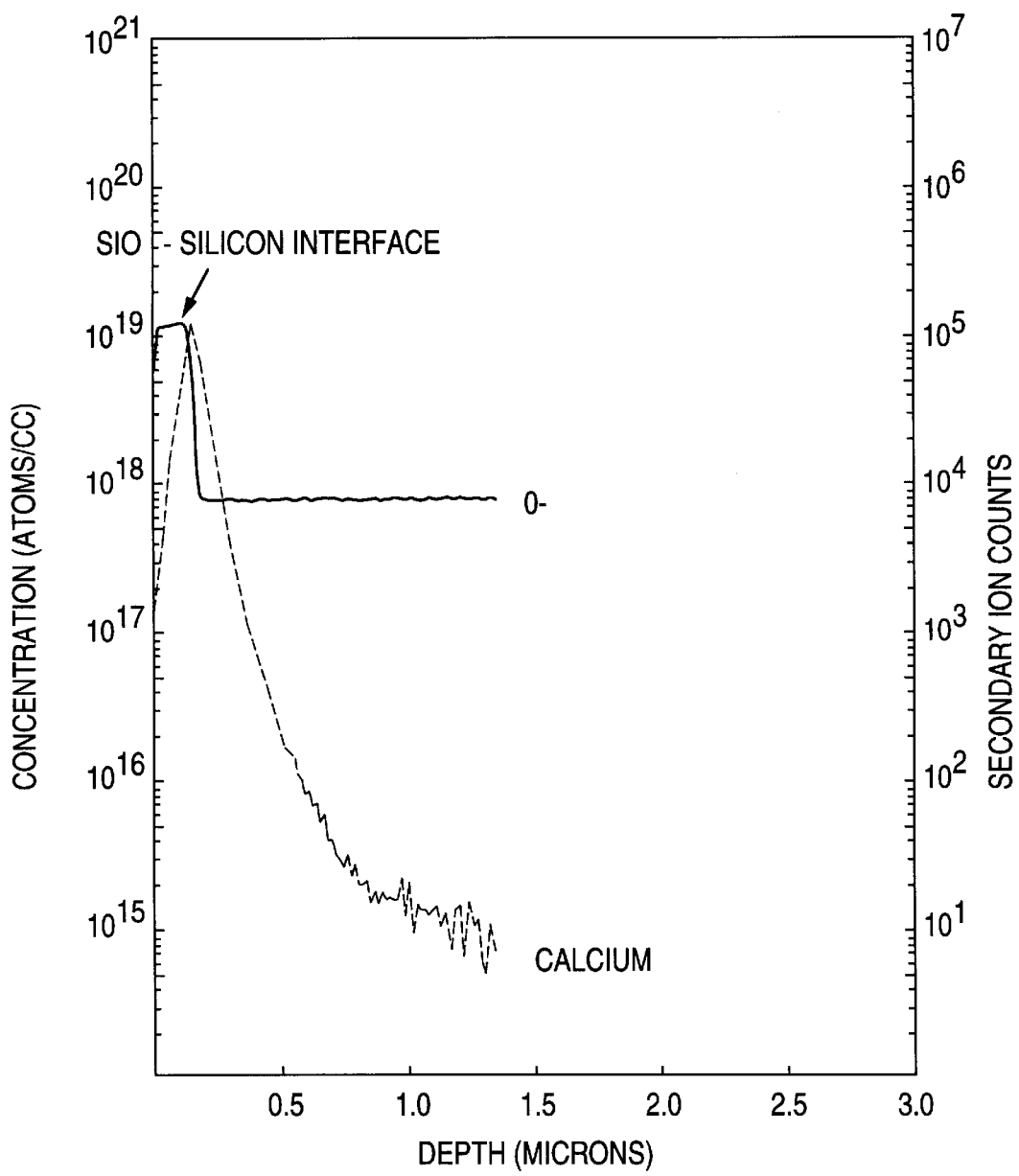
FIGS. 4a and 4b are SIMS diagrams illustrating the distribution of calcium in the substrate before and after annealing.

Samples having oxide layers with a thickness of 750 angstroms were implanted with calcium at a dosage level of $10^{14}$ cm$^{-2}$ and an implant energy of 70 KeV, as in Example II. The distribution of the calcium was determined using secondary ion mass spectroscopy (SIMS). The results of this determination are shown in FIG. 4a.

The samples were then annealed in the following sequence:

1. 500° C. in 90% $N_2$, 10% $H_2$ for 40 minutes;
2. 950° C. in 100% $N_2$ for 30 minutes;
3. 500° C. in 90% $N_2$, 10% H2 for 40 minutes.

Figure 4B:
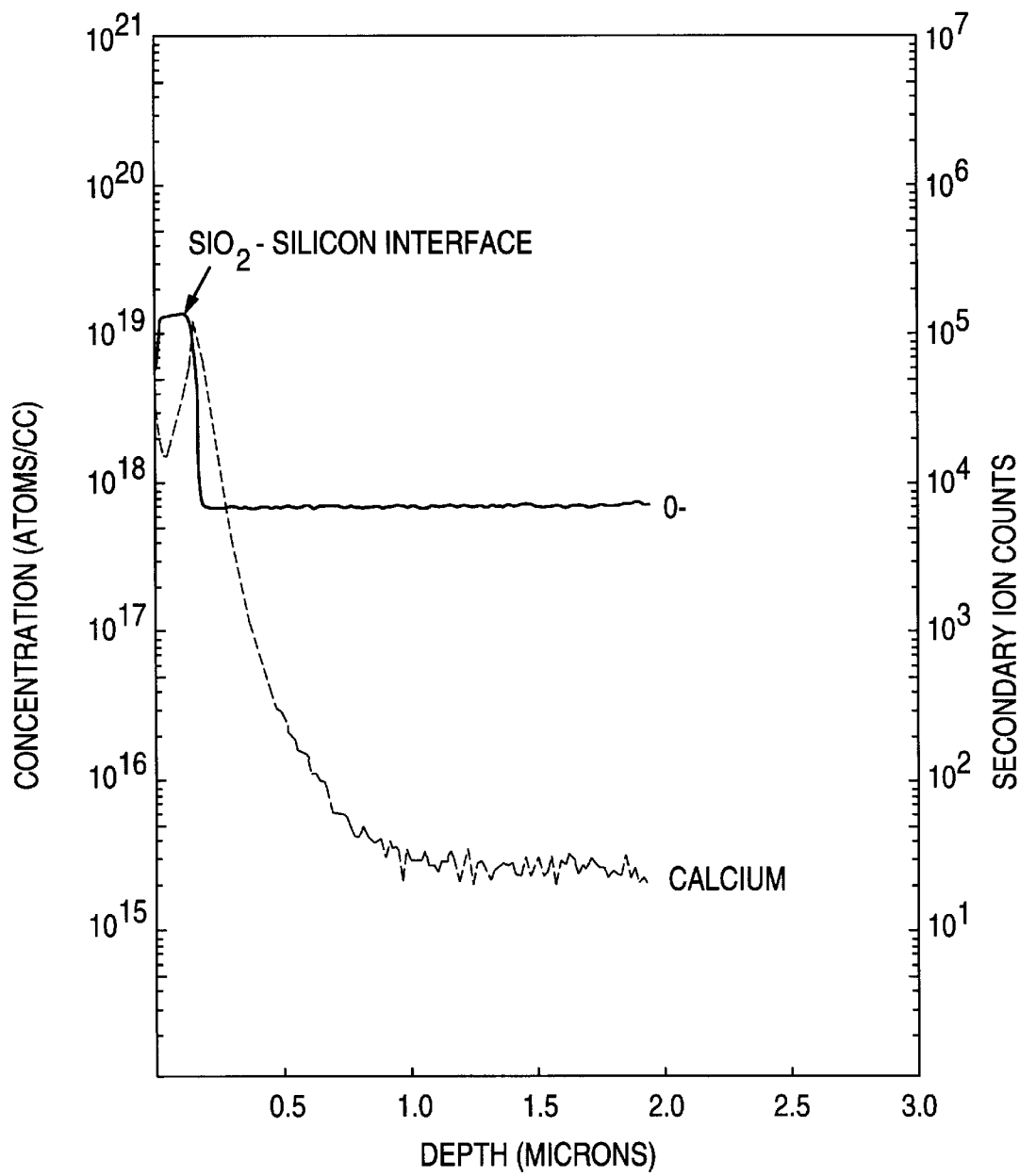

The distribution of the calcium was again determined, and the SIMS data is shown in FIG. 4b.

A comparison of the data shown in FIGS. 4a and 4b reveals that the distribution of the calcium is substantially unaffected by the annealing process. Thus, the energy level for the implant process can be chosen so that Rp falls within the final range of desired locations for the additive species.

Since atoms of the alkaline earth metals strontium and barium are larger in size than those of calcium, they are less mobile than calcium in the silicon dioxide lattice structure. Accordingly, they are more stable and contribute even higher electronic density to the system.

It will be appreciated by those of ordinary skill in the art that the present invention can be embodied in other specific forms without departing from the spirit or essential characteristics thereof. For example, the placement of the additive atomic species in the dielectric can be accomplished with an ion cluster beam (ICB) in place of ion implantation. With this technique the host lattice would be produced by means of the beam, and the additive ion introduced by switching to a different source in the beam generator.

The presently disclosed examples of the invention are therefore considered in all respects to be illustrative and not restrictive. The scope of the invention is indicated by the appended claims rather than the foregoing description, and all changes that come within the meaning and range of equivalence thereof are intended to be embraced therein.

What is claimed is:

1. A method for modifying the electrical field at the interface of a dielectric material and a semiconductor material in a monolithic circuit structure, comprising the steps of placing atoms of an alkaline earth metal in the dielectric material near the vicinity of said interface with a concentration between $10^{12}$ cm$^{-2}$ and $10^{14}$ cm$^{-2}$, and annealing said structure in a non-oxidizing ambient atmosphere with a two-step process of annealing the structure at a first temperature less than 600° C. and subsequently annealing the structure at a second temperature greater than 600° C.

2. A method for modifying the electrical field at the interface of a dielectric material and a semiconductor material in a monolithic circuit structure, comprising the steps of placing atoms of an alkaline earth metal in the dielectric material near the vicinity of said interface with a concentration between $10^{12}$ cm$^{-2}$ and $10^{14}$ cm$^{-2}$, and annealing said structure in a non-oxidizing ambient atmosphere with a two-step process of annealing the structure at a first temperature and subsequently annealing the structure at a second, higher temperature, and repeating said two-step process plural times during said annealing step.

3. The method of claim 2 wherein said first temperature is less than 600° C. and said second temperature is greater than 600° C.

4. In a monolithic circuit structure containing a layer of silicon having a layer of silicon dioxide disposed on said silicon layer to form a silicon/silicon dioxide interface, a method comprising the steps of placing atoms of an alkaline earth metal in said silicon dioxide at a distance at least 2 atomic layers away from said interface and with a concentration of at least $10^{12}$ cm$^{-2}$, and annealing said structure in a non-oxidizing ambient atmosphere with a two-step process of annealing the structure at a first temperature less than 600° C. and subsequently annealing the structure at a second temperature greater than 600° C. until a non-positive net effective charge is obtained at said interface.

5. In a monolithic circuit structure containing a layer of silicon having a layer of silicon dioxide disposed on said silicon layer to form a silicon/silicon dioxide interface, a method comprising the steps of placing atoms of an alkaline earth metal in said silicon dioxide at a distance at least 2 atomic layers away from said interface and with a concentration of at least $10^{12}$ cm$^{-2}$, annealing said structure in a non-oxidizing ambient atmosphere with a two-step process of annealing the structure at a first temperature and subsequently annealing the structure at a second, higher temperature, and repeating said two-step process plural times until a non-positive net effective charge is obtained at said interface.

6. The method of claim 5 wherein said first temperature is less than 600° C. and said second temperature is greater than 600° C.

* * * * *